(12) United States Patent
Yasuda

(10) Patent No.: US 7,875,899 B2
(45) Date of Patent: Jan. 25, 2011

(54) LIGHT-EMITTING DIODE PACKAGE AND LEAD GROUP STRUCTURE FOR LIGHT-EMITTING DIODE PACKAGE

(75) Inventor: Takaki Yasuda, Chiba (JP)

(73) Assignee: Showa Denko K.K., Tokyo (JP)

( * ) Notice: Subject to any disclaimer, the term of this patent is extended or adjusted under 35 U.S.C. 154(b) by 246 days.

(21) Appl. No.: 12/302,669

(22) PCT Filed: Jan. 7, 2008

(86) PCT No.: PCT/JP2008/050031

§ 371 (c)(1),
(2), (4) Date: Nov. 26, 2008

(87) PCT Pub. No.: WO2008/087868

PCT Pub. Date: Jul. 24, 2008

(65) Prior Publication Data

US 2009/0236618 A1    Sep. 24, 2009

(30) Foreign Application Priority Data

Jan. 15, 2007  (JP) ............................. 2007-006003

(51) Int. Cl.
  *H01L 29/18*  (2006.01)
  *H01L 33/00*  (2010.01)
  *H01L 29/207*  (2006.01)
(52) U.S. Cl. .............................. 257/99; 257/88; 257/93; 257/E33.057; 257/E33.058; 257/E33.066
(58) Field of Classification Search .................. 257/99, 257/88, 93, E33.057, E33.058, E33.066
See application file for complete search history.

(56) References Cited

U.S. PATENT DOCUMENTS

| 5,942,770 | A | * | 8/1999 | Ishinaga et al. | ................ 257/89 |
| 6,812,481 | B2 | * | 11/2004 | Matsumura et al. | ........... 257/13 |
| 7,579,628 | B2 | * | 8/2009 | Inoguchi | ...................... 257/81 |
| 2004/0240203 | A1 | | 12/2004 | Matsumura et al. | |

(Continued)

FOREIGN PATENT DOCUMENTS

JP    10-247748 A    9/1998

(Continued)

*Primary Examiner*—Phat X Cao
*Assistant Examiner*—Diana C Garrity
(74) *Attorney, Agent, or Firm*—Sughrue Mion, PLLC

(57) ABSTRACT

A light-emitting diode package 1 of the present invention is a light-emitting diode package including: a diode group 2D made of a plurality of light-emitting diode chips 2 connected in series and a lead group 3 connected to the diode group 2D, in which the lead group 3 includes: a pair of external leads 31 and 32 as terminals of the diode group 2D and auxiliary leads 33 the number of which is one less than that of the light-emitting diode chips 2, in which the plurality of the light-emitting diode chips 2 are arranged in one line on a first external lead 31 of the pair of external leads 31 and 32, in which the auxiliary leads 33 are arranged on one or both sides of a row made of the plurality of light-emitting diode chips 2, and in which the adjacent light-emitting diode chips 2 of the plurality of light-emitting diode chips 2 are connected in series via the auxiliary leads 33.

6 Claims, 6 Drawing Sheets

U.S. PATENT DOCUMENTS

| | | |
|---|---|---|
| 2005/0023551 A1* | 2/2005 | Mizuyoshi .................. 257/99 |
| 2005/0133939 A1 | 6/2005 | Chikugawa et al. |
| 2006/0261362 A1 | 11/2006 | Noda et al. |

FOREIGN PATENT DOCUMENTS

| | | |
|---|---|---|
| JP | 2004-288827 A | 10/2004 |
| JP | 2005-32661 A | 2/2005 |
| JP | 2005-183531 A | 7/2005 |
| JP | 2005-327577 A | 11/2005 |
| JP | 2006-41380 A | 2/2006 |
| JP | 2006-352064 A | 12/2006 |

* cited by examiner

LIGHT-EMITTING DIODE PACKAGE AND LEAD GROUP STRUCTURE FOR LIGHT-EMITTING DIODE PACKAGE

TECHNICAL FIELD

The present invention relates to a light-emitting diode package including a plurality of light-emitting diode chips and to a lead group structure for the light-emitting diode package.

Priority is claimed on Japanese Patent Application No. 2007-006003, filed in Japan on Jan. 15, 2007, the contents of which are incorporated herein by reference.

BACKGROUND ART

Recently, more illumination apparatuses with a light-emitting diode chip as a light source have been developed. For example, in the field of illumination apparatuses for vehicles such as automobiles, importance is attached to low power consumption, low heat generation, the degree of freedom of design, and the like. As one apparatus that satisfies these needs, an illumination apparatus made of a light-emitting diode package including a light-emitting diode chip.

A conventional light-emitting diode package is roughly made of: a light-emitting diode chip as a light source; a lead; and an insulation structure for holding the lead. In the insulation structure, there is provided a recess portion. In this recess portion, there is arranged a light-emitting diode chip. As a result, an internal surface of this recess portion serves as a reflective surface that collects rays from the light-emitting diode chip and emits them efficiently. Incidentally, a light-emitting diode chip is smaller and hence occupies a smaller volume than a conventional bulb-shaped light source. Therefore, it is assumed to be possible to place a plurality of light-emitting diode chips in one recess portion. Therefore, with a view to improving an output of an illumination apparatus, an illumination apparatus with a plurality of light-emitting diode chip placed in one recess portion is under study.

Furthermore, aside from the above package-type one, a board-type illumination apparatus is also known. A board-type illumination apparatus is made of: a packaging substrate; a light-emitting diode chip packaged on the packaging substrate; and a reflector mounted on the packaging substrate. In the reflector, there is formed a recess portion. In this recess portion, there is arranged a light-emitting diode chip. In addition, an internal surface of the recess portion is formed into a reflective surface. Furthermore, between the packaging substrate and the reflector, there is provided an epoxy resin layer for adhesion.

Patent Document 1: Japanese Unexamined Patent Publication, First Publication No. 2005-327577

Incidentally, as a reflective surface in an illumination apparatus including the above light-emitting diode package or board type illumination apparatus, there is known a reflective surface with a shape of a paraboloid of revolution. This reflective surface made of a paraboloid of revolution has only one focus, which makes it impossible to arrange all the plurality of light-emitting diode chips at the focus. Therefore, it is typically configured such that a plurality of light-emitting diode chips are placed around the focus as a center. In the case where the illumination apparatus with such configuration is lighted, it is difficult to emit parallel rays.

Furthermore, in the recess portion provided to the insulation structure of the light-emitting diode package, there is filled a transparent resin including a phosphor. However, light rays with angles less acute than a total reflection angle defined by the ratio between the refractive index of the sealing resin and that of the air are not allowed to be emitted to the outside, leading to a problem of low light-extraction efficiency. However, if light rays are incident perpendicularly on the sealing resin, it is possible to make the light-extraction efficiency close to 100%.

On the other hand, in the aforementioned board-type illumination apparatus, a part of the rays emitted from the light-emitting diode chip is absorbed in an epoxy resin substrate layer for copper pattern insulation, leading to a problem of further lower light-extraction efficiency.

As for a parabolic reflector for multi-chips, a plurality of light-emitting diode chips are arranged in one line for optimization of the reflector shape, to thereby make it possible to maximize the generated parallel rays (for example, see Japanese Patent Application No. 2006-189206). In the case of connecting the plurality of light-emitting diode chips in parallel, each input/output lead and each of the light-emitting diode chips may be individually connected using a bonding wire. Therefore, it is possible to arrange the light-emitting diode chips in one line. However, if the light-emitting diode chips are intended to be connected in a series, it is difficult to directly connect the light-emitting diode chips using bonding wires. Therefore, it is required to provide an auxiliary lead between the light-emitting diode chips, and to connect them using the bonding wire via this auxiliary lead. This necessitates arrangement of auxiliary leads other than the input/output leads. As a result, the shape of the lead is extremely complicated. In addition, it is impossible to make a space between the light-emitting diode chips smaller. Therefore, there is a possibility that light collectivity will be decreased instead.

DISCLOSURE OF INVENTION

The present invention has been achieved in view of the above circumstances, and has an object to provide a light-emitting diode package that is excellent in luminous efficiency, has a large light quantity, and is capable of transforming rays emitted from respective light-emitting diode chips into parallel rays for efficient light collection, and to provide a lead group structure for the light-emitting diode package.

To achieve the above objects, the present invention adopts the following.

[1] A light-emitting diode package including: a diode group made of a plurality of light-emitting diode chips connected in series; and a lead group connected to the diode group, in which the lead group includes: a pair of external leads as terminals of the diode group; and auxiliary leads the number of which is one less than that of the light-emitting diode chips, in which the plurality of the light-emitting diode chips are arranged in one line on a first external lead of the pair of external leads, in which the auxiliary leads are arranged on one or both sides of a row made of the plurality of the light-emitting diode chips, and in which the adjacent light-emitting diode chips of the plurality of light-emitting diode chips are connected in series via the auxiliary leads.

Furthermore, it is preferable that the present invention be the following.

[2] The light-emitting diode package according to the above 1, in which an element placement portion on which the light-emitting diode chips are placed are formed on the first external lead, p-electrodes and n-electrodes of the light-emitting diode chips face to a side opposite to the element placement portion, and the p-electrodes and the n-electrodes are connected to the auxiliary leads via bonding wires.

[3] The light-emitting diode package according to the above 2, in which a front end of the element placement portion is arranged close to a second external lead.

[4] The light-emitting diode package according to the above 2 or the above 3, in which a zener diode is attached between the front end of the element placement portion and the second external lead.

[5] The light-emitting diode package according to any of the above 1 to the above 4, further including an insulation structure for holding the lead group to which the diode group is connected, in which the diode group is exposed from a recess portion formed in the insulation structure.

[6] The light-emitting diode package according to the above 5, in which the shape of the recess portion seen in a planar view is a substantially oval shape a long axis of which extends along an arrangement direction of the plurality of light-emitting diode chips, and the internal surface of the recess portion is a paraboloidal reflective surface.

Furthermore, the present invention is as the following.

[7] A lead group structure for a light-emitting diode package including: a diode group in which a plurality of light-emitting diode chips are connected; and a lead group connected to the diode group, in which the lead group structure includes: a pair of external leads as terminals of the diode group; and auxiliary leads the number of which is one less than that of the light-emitting diode chips, in which a placement portion on which the plurality of the light-emitting diode chips are arranged in one line is provided on a first external lead of the pair of external leads, and in which the auxiliary leads are arranged on one or both sides of the placement portion.

According to the present invention, it is possible to provide a light-emitting diode package that has a large light quantity, and is capable of transforming rays emitted from respective light-emitting diode chips into parallel rays for efficient light collection, and to provide a lead group structure for the light-emitting diode package.

DESCRIPTION OF THE REFERENCE SYMBOLS 1, 101, 201 . . . light-emitting diode package; 2, 2A to 2C, 102, 102A to 102D, 202 . . . light-emitting diode chip; 2b, 102b . . . p-electrode; 2c, 102c . . . n-electrode; 2D, 102E . . . diode group; 3, 103 . . . lead group; 4 . . . insulation structure; 8: zener diode; 31, 131, 231 . . . first external lead (external lead); 31b, 13b . . . element placement portion; 32, 132, 232 . . . second external lead (external lead); 33, 33A, 33B, 133, 133A to 133C, 233 . . . auxiliary lead; 41 . . . recess portion; 46 . . . reflective surface; 51a to 51f, 151a to 151h . . . bonding wire;

BEST MODE FOR CARRYING OUT THE INVENTION (One Example of a Light-emitting Diode Package)

Figure 1:
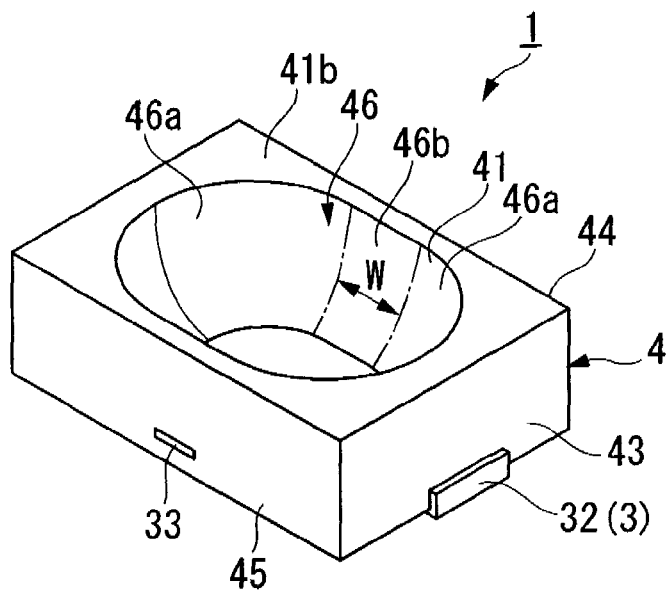
FIG. 1 is a perspective view showing one example of a light-emitting diode package according to the present embodiment.
Figure 2:
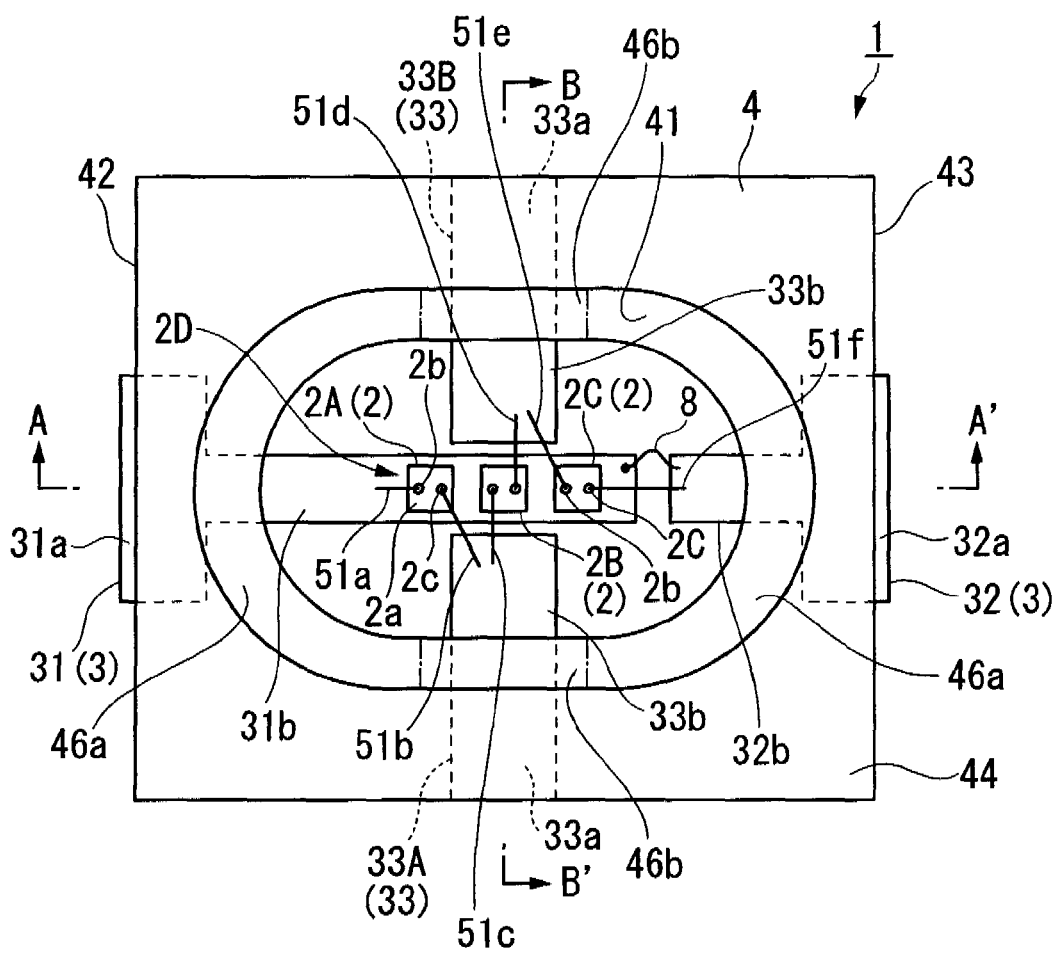
FIG. 2 is a schematic plan view of the light-emitting diode package shown in FIG. 1.
Figure 3:
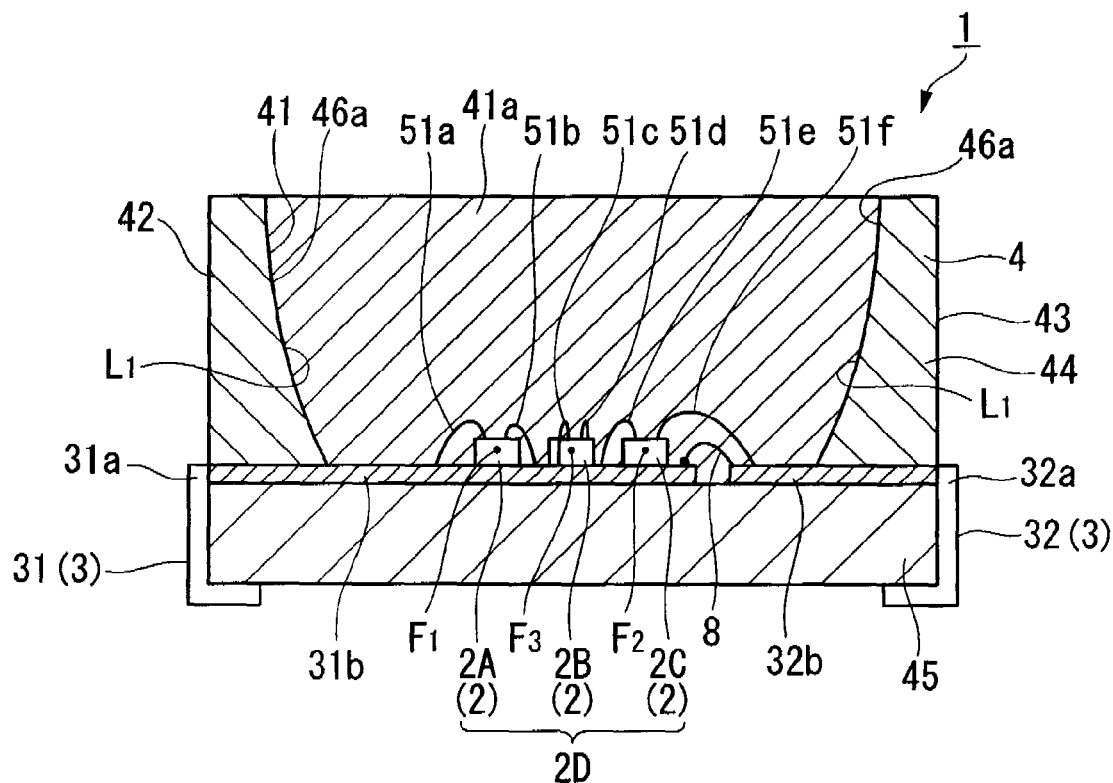
FIG. 3 is a schematic cross-sectional view corresponding to the A-A' line of FIG. 2.
Figure 4:
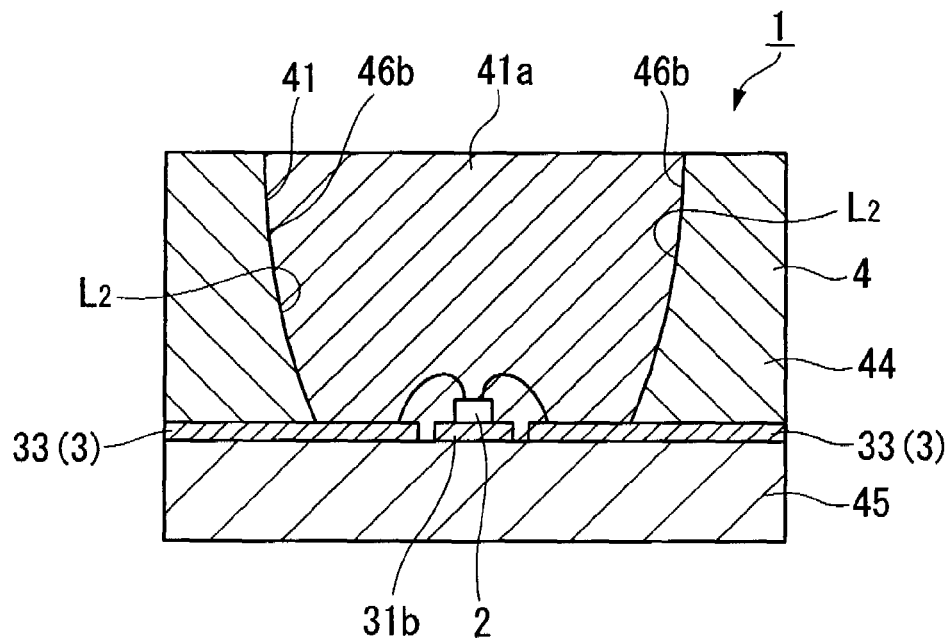
FIG. 4 is a schematic cross-sectional view corresponding to the B-B' line of FIG. 2.

Hereunder is a description of one example of an embodiment of a light-emitting diode package according to the present invention, with reference to drawings. The figures referred to in the following description are provided for describing a configuration of a light-emitting diode package according to the present embodiment. Therefore, the size, the thickness, the dimension, and the like of the respective portions shown in the figures may be different from those in the actual light-emitting diode package in terms of a dimensional relationship. FIG. 1 is a perspective view showing one example of a light-emitting diode package according to the present embodiment. FIG. 2 is a schematic plan view showing the light-emitting diode package shown in FIG. 1. Furthermore, FIG. 3 is a schematic cross-sectional view corresponding to the A-A' line of FIG. 2. FIG. 4 is a schematic cross-sectional view corresponding to the B-B' line of FIG. 2.

A light-emitting diode package 1 shown in FIG. 1 to FIG. 4 is used as for example an illumination apparatus. It is roughly made of: a plurality of light-emitting diode chips 2; a lead group 3 (lead group structure) to which the light-emitting diode chips 2 are connected; and an insulation structure 4 for holding the lead group 3 as a whole. In the insulation structure 4, there is provided a recess portion 41. In this recess portion 41, the light-emitting diode chips 2 are sealed, and are protected by a transparent sealing resin 41a. As a result, it is possible to extract light from the light-emitting diode chips 2 via the recess portion 41.

The light-emitting diode chip 2 includes: a semiconductor light-emitting layer; a p-electrode 2b arranged on the semiconductor light-emitting layer; and an n-electrode 2c arranged in a planarly spaced manner from the p-electrode 2b. The p-electrode 2b is connected to a later-described p-type semiconductor layer. On the other hand, the n-electrode 2c is connected to an n-type semiconductor layer. The size of the light-emitting diode chip 2 is not particularly limited. However, it is preferably 0.1 mm to 30 mm square.

The semiconductor light-emitting layer is one in which an n-type semiconductor layer, a light-emitting layer, and a p-type semiconductor layer are provided on a substrate. As a substrate material in the present invention, a conductive material can be used such as: an oxide monocrystal such as a sapphire monocrystal, a spinel monocrystal, a ZnO monocrystal, a $LiAlO_2$ monocrystal, a $LiGaO_2$ monocrystal, and a MgO monocrystal; a Si monocrystal; a SiC monocrystal; a GaAs monocrystal; a GaP crystal; an AlN monocrystal; a GaN monocrystal; and a boride monocrystal such as $ZrB_2$. In addition, a form in which a semiconductor light-emitting element is mounted on a different substrate such as a glass can also be used.

As the n-type semiconductor layer, the light-emitting layer, and the p-type semiconductor layer, for example semiconductors based on As, P, or nitride can be used. As a nitride-based semiconductor, for example a gallium nitride-based compound semiconductor represented by a general formula of $Al_xGa_yIn_zN_{1-a}M_a$ (where $0 \leqq x \leqq 1$, $0 \leqq y \leqq 1$, $0 \leqq z \leqq 1$, and $x+y+z=1$. The symbol M denotes a group V element different from nitrogen (N), and $0 \leqq a < 1$) can be used. A nitride-based semiconductor can include, apart from Al, Ga, and In, other group III elements. It can also include elements such as Ge, Si, Mg, Ca, Zn, Be, P, and As, as required. Furthermore, it may include not only consciously added elements, but also impurities incidentally mixed depending on the deposition conditions and the like, and trace impurities contained in the raw material and the reaction tube material.

The n-type semiconductor layer is typically made of: a foundation layer; an n contact layer; and an n cladding layer.

The n contact layer can also serve as the foundation layer and/or the n cladding layer. It is preferable that the foundation layer be made of an $Al_xGa_{1-x}N$ layer (where $0 \leqq x \leqq 1$, preferably $0 \leqq x \leqq 0.5$, more preferably $0 \leqq x \leqq 0.1$). It is preferable that similarly to the foundation layer, the n contact layer be made of an $Al_xGa_{1-x}N$ layer (where $0 \leqq x \leqq 1$, preferably $0 \leqq x \leqq 0.5$, more preferably $0 \leqq x \leqq 0.1$). Furthermore, it is preferable that the nitride semiconductor constituting the n contact layer have the same composition as that of the foundation layer.

It is preferable that an n cladding layer be provided between the n contact layer and the light-emitting layer. It is possible to form the n cladding layer from AlGaN, GaN, GaInN, or the like. Furthermore, it may be formed by a heterojunction of these, or by a superlattice structure where these are laminated a plurality of times.

As the light-emitting layer, a light-emitting layer made from a nitride-based semiconductor of $Ga_{1-s}In_sN$ ($0 < s < 1$) is preferably used. Other than the single multiple quantum well (SQW) structure, the light-emitting layer may have a multiple quantum well (MQW) structure that is made of: layers of the above $Ga_{1-s}In_sN$ as well layers; and $Al_cGa_{1-c}N$ ($0 \leqq c \leqq 1$) barrier layers whose band gap energy is larger than that of the well layer.

The p-type semiconductor layer is typically made of: a p cladding layer; and a p contact layer. It is preferable that the p cladding layer be made from $Al_dGa_{1-d}N$ ($0 < d \leqq 1$, preferably $0.1 \leqq d \leqq 0.3$). The p contact layer is made of a nitride-based semiconductor layer including at least $Al_eGa_{1-e}N$ ($0 \leqq e < 1$, preferably $0 \leqq e \leqq 0.2$, and more preferably $0 \leqq e \leqq 0.1$).

The arrangement of the p-electrode 2b and the n-electrode 2c in the light-emitting diode chip 2 is not particularly limited. For example, as shown in FIG. 2, the p-electrode 2b and the n-electrode 2c may be arranged on an intermediate line between the opposing two edges of the light-emitting diode chip 2, or may be arranged on a diagonal line of the light-emitting diode chip 2. Furthermore, the p-electrode 2b and the n-electrode 2c may have any planar shape so long as it has an area that allows wire bonding. It may be a circular shape as shown in FIG. 2.

For the p-electrode 2b and the n-electrode 2c, material such as Au, Al, Ni, and Cu can be used.

Next, the lead group 3 is made of: a first external lead 31; a second external lead 32; and two auxiliary leads 33. The respective leads 31 to 33 are integrated by a substantially cubic insulation structure 4 in a state of being insulated from each other. Furthermore, the leads 31 to 33 are formed by, for example, punching a thin plate into a predetermined shape, the thin plate being made from a metal material that is a basis metal such as Cu or a Cu-based alloy, an Fe-based alloy, or Ni with a thickness of approximately 0.1 to 0.2 μm and is plated with a noble metal such as Au or Ag.

The first external lead 31 is made of: a terminal portion 31a a part of which is protruded from one side wall surface 42 of the insulation structure 4; and a band-shaped element placement portion 31b extending from the terminal portion 31a to the interior of the insulation structure 4. On this band-shaped element placement portion 31b, there are placed three light-emitting diode chips 2 in a line along the longitudinal direction thereof. Each of the light-emitting diode chips 2 is placed on the element placement portion 31b with the p-electrode 2b and the n-electrode 2c facing upward.

In other words, the light-emitting diode chips 2 are placed on the element placement portion 31b in a state with an insulating substrate that is used as the semiconductor light-emitting layer being in contact with the element placement portion 31b. Note that the element placement portion 31b may have a thickness larger than that of the terminal portion 31a to thereby impart a heat sink function to the element placement portion 31b.

Next, the second external lead 32 is made of: a terminal portion 32a that is protruded from the other side wall surface 43 of the insulation structure 4; and a band-shaped internal terminal portion 32b extending from the terminal portion 32a to the interior of the insulation structure 4. The internal terminal portion 32b is arranged in the extension in the longitudinal direction of the aforementioned element placement portion 31b. As a result, a front end of the internal terminal portion 32b and a front end of the element placement portion 31b are close to each other. Between the internal terminal portion 32b and the element placement portion 31b, there is attached a zener diode 8 for prevention of electrostatic discharge.

The respective terminal portions 31a, 32a of the respective external leads 31 and 32 are buried in the insulation structure 4 except the portions protruded from the side wall surfaces 42 and 43. Furthermore, of the respective terminal portions 31a and 32a, the portions protruded from the side wall surfaces 42 and 43 are bent toward a bottom surface of the insulation structure 4.

Next, the auxiliary leads 33 are arranged on both sides in the longitudinal direction of the element placement portion 31b. Each of these auxiliary leads 33 is a band-shaped member as shown in FIG. 2. It extends along a direction that intersects the longitudinal direction of the element placement portion 31b. One end 33a thereof is buried by the insulation structure 4. The other end 33b thereof is arranged at a position facing the element placement portion 31b from a lateral direction. The number of the auxiliary leads 33 may be one less than that of the light-emitting diode chips 2. If three light-emitting diode chips 2 are provided, two auxiliary leads 33 may be provided.

Next is a description of a connection condition of the light-emitting diode chips 2 placed on the element placement portion 31b to the respective leads 31 to 33.

First, of the three light-emitting diode chips 2 arranged in one line, the p-electrode 2b of the light-emitting diode chip 2A arranged closest to the terminal portion 31a of the first external lead 31 is conductively connected to the element placement portion 31b via the bonding wire 51a. Furthermore, the n-electrode 2c of the light-emitting diode chip 2A is conductively connected to one auxiliary lead 33A via the bonding wire 51b.

The p-electrode 2b of the light-emitting diode chip 2B arranged at the center is conductively connected to the auxiliary lead 33A via the bonding wire 51c. Furthermore, the n-electrode 2c of the light-emitting diode chip 2B is conductively connected to the other auxiliary lead 33B via the bonding wire 51d.

In addition, the p-electrode 2b of the light-emitting diode chip 2C arranged closest to the second external lead 32 is conductively connected to the other auxiliary lead 33B via the bonding wire 51e.

Furthermore, the n-electrode 2c of the light-emitting diode chip 2C is conductively connected to the internal terminal portion 32b of the second external lead 32 via the bonding wire 51f.

As described above, the light-emitting diode chips 2A to 2C and the respective leads 31 to 33 constituting the lead group 3 are connected in series via the bonding wires 51a to 51f, in the order of the external lead 31, the light-emitting diode chip 2A, the auxiliary lead 33A, the light-emitting diode chip 2B, the auxiliary lead 33B, the light-emitting diode chip 2C, and the external lead 32.

That is, the light-emitting diode chips 2A to 2C are connected in series to constitute a diode group 2D. To both ends of this diode group 2D, the external leads 31 and 32 are connected. In addition, between the respective light-emitting diode chips 2A to 2C that constitute the diode group 2D, the auxiliary leads 33A and 33B are conductively connected. The auxiliary leads 33A and 33B conductively connected between the respective light-emitting diode chips 2A to 2C are arranged on both sides in the width direction of the band-shaped element placement portion 31b. This makes it possible to arrange the light-emitting diode chips 2A to 2C close to each other. The auxiliary leads 33A and 33B may be arranged on one side in the width direction of the element placement portion 31b. In this case, the feeding direction of the bonding wire 51b to 51e that are respectively fed from the p-electrode 2b and n-electrode 2c of the light-emitting diode chip 2 are the same, leading to a possibility of a short circuit due to contact between the adjacent bonding wires. Therefore, it is preferable that the auxiliary leads 33A and 33B be arranged on both sides in the width direction of the element placement portion 31b.

Next, the insulation structure 4 is made of an upper sealing portion 44 and a lower sealing portion 45 that sandwich the lead group 3 from both sides in the thickness direction thereof. The upper sealing portion 44 and the lower sealing portion 45 sandwich the respective leads 31 to 33 that constitute the lead group 3, and also are coupled to each other via the space between the respective leads 31 to 33. The upper sealing portion 44 and the lower sealing portion 45 may be made from a mold-formed or insert-molded insulating resin such as: an amide resin such as polyphthalamide, an imide resin, a polycarbonate resin, polyphenylene sulfide (PPS), a liquid crystal polymer (LCP), an ABS resin, an epoxy resin, a phenolic resin, an acrylic resin, a PBT resin, and a glass epoxy.

In the upper sealing portion 44, there is formed a recess portion 41. A wall surface defining this recess portion 41 is a reflective surface 46. The reflective surface 46 is a white diffuse reflective surface, preferably a glossy reflective surface, more preferably a specular reflective surface. Seen in a planar view, the recess portion 41 has a substantially oval shape whose long axis extends along an arrangement direction of the light-emitting diode chips 2. Furthermore, the upper sealing portion 44 is arranged on the upper side of the lead group 3, that is, on the light-emitting diode chips 2 side, and hence the light-emitting diode chips 2 are arranged in the inside of the recess portion 41. Thereby, the light-emitting diode chips 2 are surrounded by the reflective surface 46. Furthermore, in the recess portion 41, there is filled a transparent sealing resin 41a. In the sealing resin 41a, there may be included a phosphor. For example, if the light-emitting diode chips 2 are blue light-emitting diode chips, a yellow phosphor is included in the sealing resin 41a to thereby make it possible to obtain white light.

As shown in FIG. 1 to FIG. 4, the reflective surface 46 is made of: a pair of half paraboloids of revolution 46a; and parabolic pillar surfaces 46b arranged between the half paraboloids of revolution 46a. In FIG. 1 and FIG. 2, border lines between the half paraboloid of revolution 46a and the parabolic pillar surface 46b are represented by single-dot chain lines. On these border lines, the half paraboloid of revolution 46a and the parabolic pillar surface 46b are continuous to each other.

Here, the half paraboloid of revolution 46a is one of the planes formed by dividing the so-called paraboloid of revolution into two by a plane surface including its central axis of rotation. Furthermore, as shown in FIG. 3, this half paraboloid of revolution 46a is a plane formed along a parabolic curve $L_1$ represented by a formula of $y=ax^2$ (where a is in the range of $\frac{1}{10}$ to 1, and preferably $\frac{1}{3}$).

As shown in FIG. 4, the parabolic pillar surface 46b is a substantially band-shaped plane formed along a parabolic curve $L_2$ represented by a formula of $y=bx^2$ (where b has the same value as that of a, that is, in the range of $\frac{1}{10}$ to 1, preferably $\frac{1}{3}$). The width w of the parabolic pillar surface 46b is appropriately set according to the size of the light-emitting diode chips 2 and the space between the light-emitting diode chips 2. For example, in the case of using light-emitting diode chips 1 mm square, the width w is preferably set in the range of 1.0 mm to 2.5 mm.

The thickness of the upper sealing portion 44, in other words, the height of the reflective surface 46 along an emission direction of the rays is appropriately set according to the size of the light-emitting diode chips 2 and the space between the light-emitting diode chips 2. For example, the height is preferably set in the range of, for example, 5.0 mm to 20.0 mm.

Next is a description of an arrangement relationship between foci of the reflective surface 46 and the light-emitting diode chips 2. The reflective surface 46 in the present embodiment has three foci $F_1$ to $F_3$, and the light-emitting diode chip 2 is arranged at the respective foci $F_1$ to $F_3$. The reflective surface 46 in the present embodiment is made of a pair of half paraboloids of revolution 46a and the parabolic pillar surfaces 46b, as described above. Each of the half paraboloids of revolution 46a has one focus, and hence a total of two foci $F_1$ and $F_2$ are present. These two foci $F_1$ and $F_2$ correspond to the foci of the paraboloid of revolution on which the half paraboloids of revolution 46a are based. That is, the foci of a paraboloid of revolution are originally present at positions a predetermined distance spaced apart from its vertex along its central axis of rotation. The paraboloid of revolution is cut into two along a plane including this central axis of rotation, to thereby form the half paraboloids of revolution 46a and 46a. As a result, the foci in the paraboloid of revolution correspond to the foci $F_1$ and $F_2$.

Next, the focus $F_3$ that corresponds to the parabolic pillar surface 46b is positioned at the middle point of a line segment connecting the two foci $F_1$ and $F_2$. It is preferable that the light-emitting diode chips disposed at these foci have light-emitting layers aligned on this line segment.

As described above, the respective light-emitting diode chips 2 are arranged, in an evenly spaced manner, on the line connecting between the foci $F_1$ and $F_2$ of the pair of half paraboloids of revolution 46a. Of the three, two light-emitting diode chips 2A and 2C are arranged at the respective foci $F_1$ and $F_2$ of the half paraboloids of revolution 46a, and the other light-emitting diode chip 2B is arranged at the focus $F_3$ between the foci $F_1$ and $F_2$.

The space between the respective light-emitting diode chips 2 is appropriately set according to the size of the light-emitting diode chips 2. For example, in the case of using light-emitting diode chips 1 mm square, the space between the respective diodes is preferably set in the range of 0.5 mm to 1.5 mm.

In the above-mentioned light-emitting diode package 1, when the light-emitting diode chips 2 arranged at the foci $F_1$ to $F_3$ of the reflective surface 46 are lighted, the rays of light are reflected by the half paraboloids of revolution 46a and the parabolic pillar surfaces 46b that constitute the reflective surface 46, and are efficiently emitted as substantially parallel rays from the sealing resin. The light quantity of the light flux made of the emitted rays is substantially uniform over the entire surface of its illuminated area. In addition, the number of the light-emitting diode chips serving as a light source is three, increasing the light quantity itself.

(Manufacturing Method of Light-emitting Diode Package)

The light-emitting diode package 1 of the present embodiment can be manufactured for example in the manner as follows:

First, the light-emitting diode chips 2 are manufactured. That is, an n-type semiconductor layer, a light-emitting layer, and a p-type semiconductor layer are formed on a substrate by use of a method such as sputtering, MOCVD (metal organic chemical vapor deposition), HVPE (hydride vapor phase epitaxy), or MBE (molecular beam epitaxy), to thereby form a semiconductor light-emitting layer. Then, the photolithography technique and the lift-off technique are used to form a p-electrode 2b and an n-electrode 2c on the obtained semiconductor light-emitting layer, thus obtaining a light-emitting diode chip 2.

Figure 5:
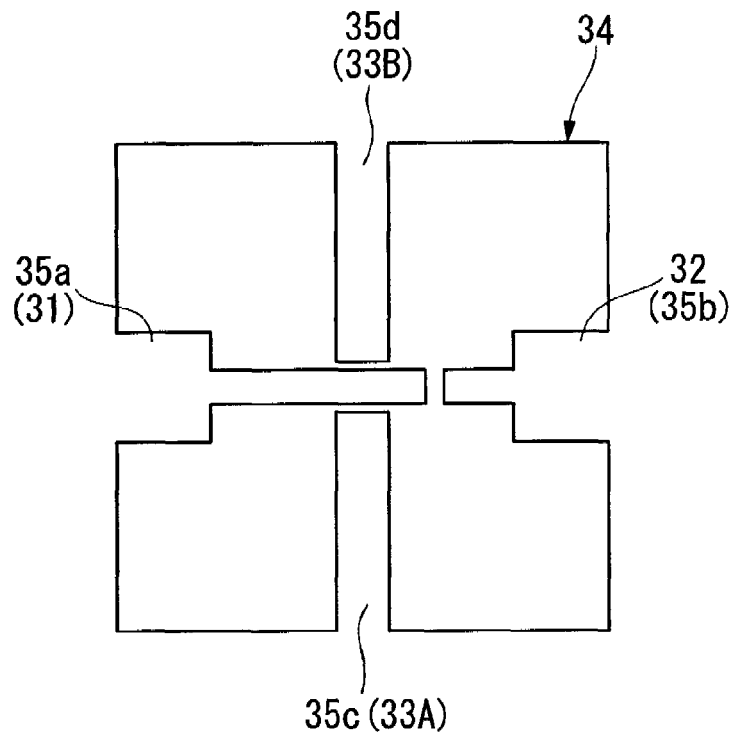
FIG. 5 is an enlarged plan view showing only a basic unit shape of a lead frame for describing a manufacturing method of the light-emitting diode package shown in FIG. 1.
Figure 6:
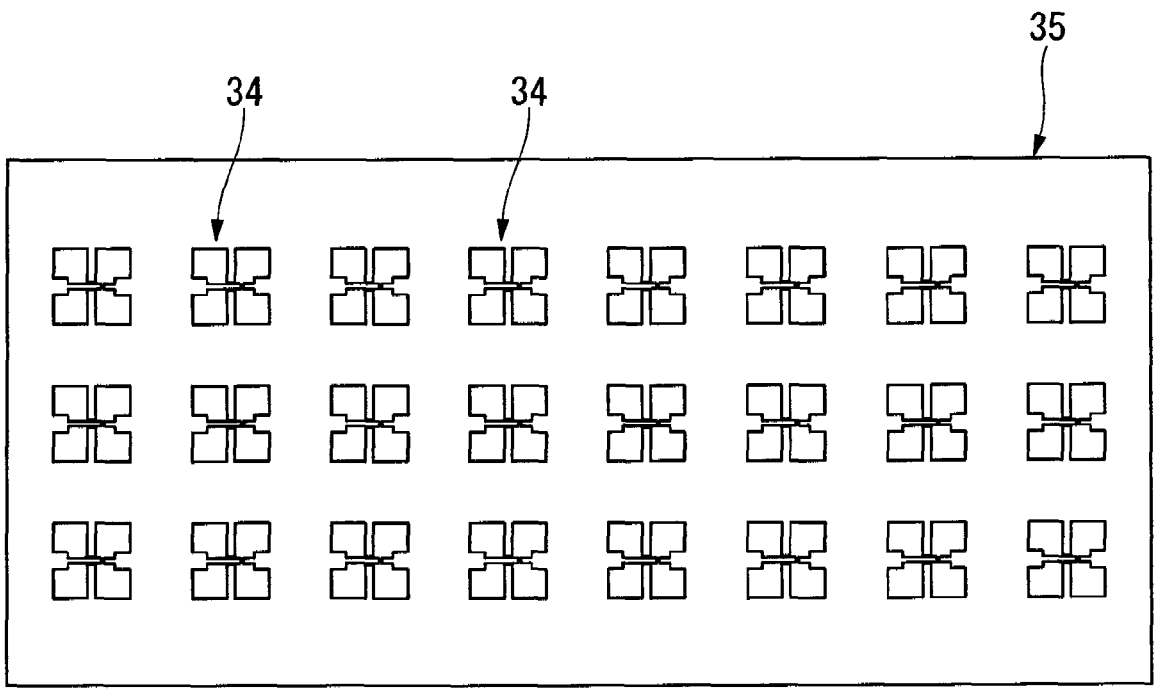
FIG. 6 is a plan view showing the whole of the lead frame for describing the manufacturing method of the light-emitting diode package shown in FIG. 1.

Next is a manufacturing method of a lead frame. A metal plate is punched to form a lead frame 35, as shown in FIG. 6, having a plurality of basic unit shapes 34, as shown in FIG. 5, each of which is to serve as the first external lead 31, the second external lead 32, and the auxiliary leads 33A and 33B. In FIG. 5, the reference numeral 35a denotes a portion to be the first external lead 31, a reference numeral 35b denotes a portion to be the second external lead 32, a reference numeral 35c denotes a portion to be the auxiliary lead 33A, and a reference numeral 35d denotes a portion to be the auxiliary lead 33B.

Figure 7:
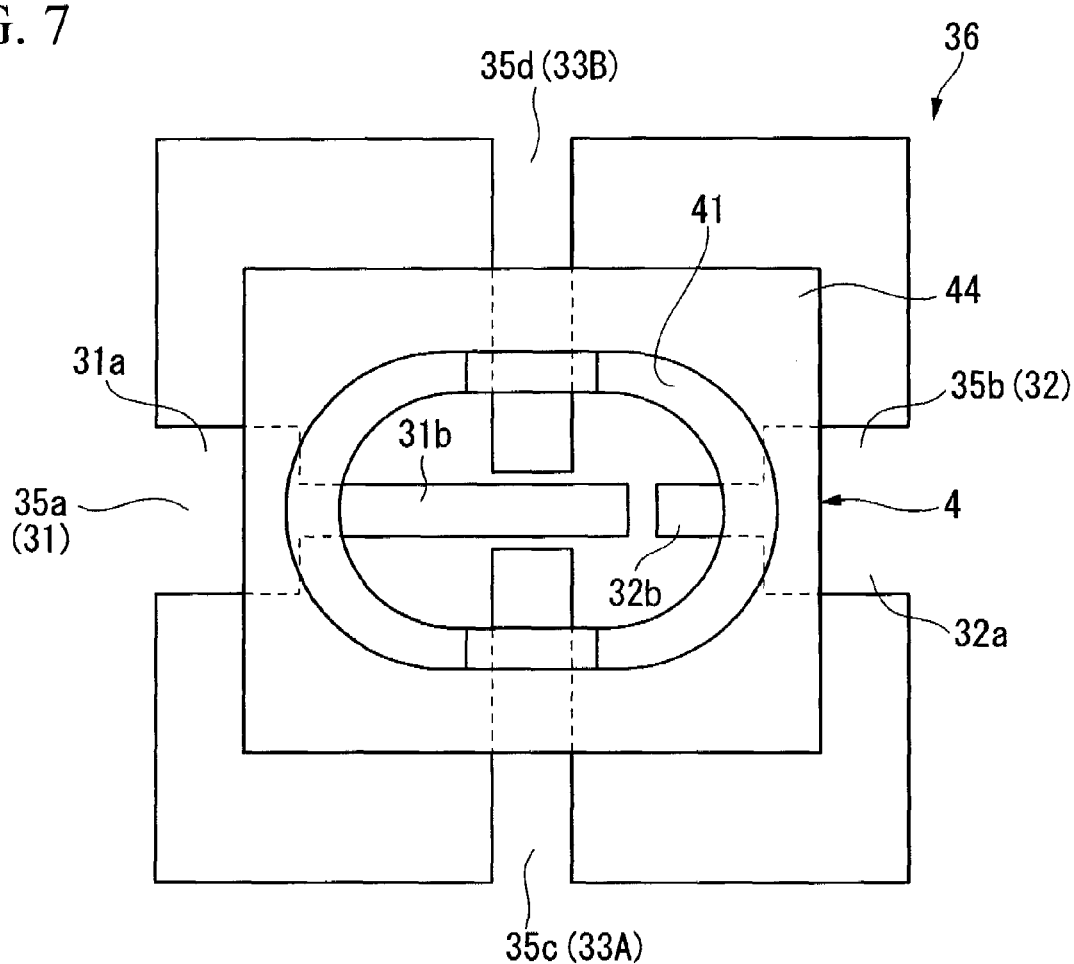
FIG. 7 is an enlarged plan view showing only a basic unit shape of a mold lead frame for describing the manufacturing method of the light-emitting diode package shown in FIG. 1.
Figure 8:
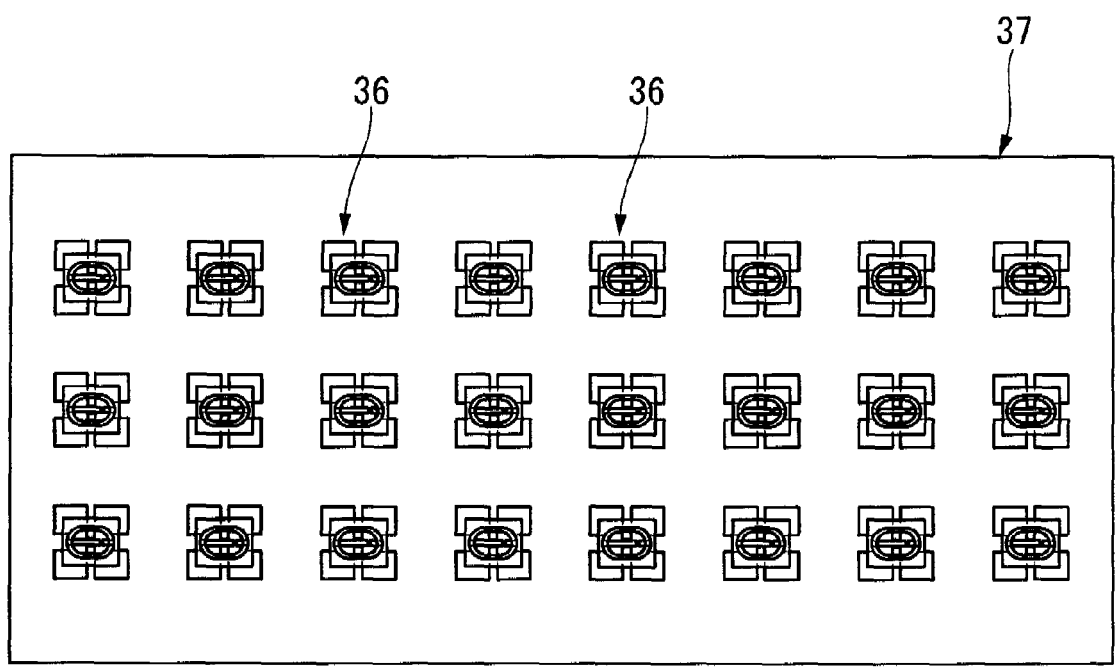
FIG. 8 is a plan view showing the whole of the mold lead frame for describing the manufacturing method of the light-emitting diode package shown in FIG. 1.

Next, on the lead frame shown in FIG. 5, there is a mold-formed resin material which is to be the upper sealing portion 44 and the lower sealing portion 45 of the insulation structure 4. Thereby, there is formed a mold lead frame 37, as shown in FIG. 8, having a plurality of basic unit shapes 36, as shown in FIG. 7, in each of which are formed the insulation structure 4 with the recess portion 41, the first external lead 31, the second external lead 32, and the auxiliary leads 33A and 33B.

Next, on each of the element placement portions 31b of the first external lead 31 exposed from the recess portions 41 of the mold lead frame 37, three light-emitting diode chips 2 are mounted in one line along the longitudinal direction of the element placement portion 31b.

Next, by the wire bonding, the p-electrode 2b of the light-emitting diode chip 2A arranged closest to the terminal portion 31a of the first external lead 31 is conductively connect to the element placement portion 31b via the bonding wire 51a, and also the n-electrode 2c of the light-emitting diode chip 2A is conductively connect to the auxiliary lead 33A via the bonding wire 51b.

Subsequently, the p-electrode 2b of the light-emitting diode chip 2B arranged in the middle is conductively connected to the auxiliary lead 33A via the bonding wire 51c, and also the n-electrode 2c of the light-emitting diode chip 2B is conductively connected to the auxiliary lead 33B via the bonding wire 51d.

Subsequently, the p-electrode 2b of the light-emitting diode chip 2C arranged closest to the second external lead 32 is conductively connected to the auxiliary lead 33B via the bonding wire 51e, and also the n-electrode 2c of the light-emitting diode chip 2C is conductively connected to the internal terminal portion 32b of the second external lead 32 via the bonding wire 51f.

After that, the sealing resin 41a is filled in the recess portion 41. The mold lead frame 37 is then cut into the individual light-emitting diode packages, obtaining the light-emitting diode packages of the present embodiment.

As described above, according to the above-mentioned light-emitting diode package 1, the auxiliary leads 33 for connecting the light-emitting diode chips 2 are arranged on one or both sides of the row made of the light-emitting diode chips 2. This makes it possible to narrow the space between the light-emitting diode chips 2. As a result, it is made easy to generate parallel rays in the light-emitting diode package 1, and it is possible to enhance the light-extraction efficiency and the light collection efficiency. It is also possible to reduce the size of the light-emitting diode package 1.

Furthermore, the light-emitting diode chips 2 are arranged in one line. Therefore, the ability to generate parallel rays in the light-emitting diode package 1 is improved, making it possible to further enhance the light collection efficiency.

In addition, the light-emitting diode chips 2 are placed on the first external lead 31 that serves as an external terminal of the diode group 2D. This eliminates the necessity of additionally providing a member on which the light-emitting diode chips 2 are placed. Therefore, the number of the parts is reduced, making it possible to further reduce the size of the light-emitting diode package 1.

Furthermore, the p-electrodes 2b and the n-electrodes 2c of the light-emitting diode chips 2 face to the side opposite to the element placement portion 31b side, and also the p-electrodes 2b and the n-electrodes 2c are connected to the auxiliary leads 33A and 33B via the bonding wires 51b to 51e. Therefore, the p- and n-electrodes 2b, 2c are insulated from the element placement portion 31b, and are also brought into conduction with the auxiliary leads 33A and 33B. This makes it possible to simultaneously light the respective light-emitting diode chips 2.

In addition, the front end of the element placement portion 31b is arranged close to the second external lead 32. Therefore, it is possible to easily attach a protection circuit or the like between the first external lead 31 including the element placement portion 31b and the second external lead 32.

In addition, the zener diode 8 is attached between the front end of the element placement portion 31b and the second external lead 32. Therefore, it is possible to prevent damage by electrostatic discharge.

Furthermore, the insulation structure 4 for holding the lead group 3 is provided, and the recess portion 41 for exposing the diode group 2D is provided in this insulation structure 4. Therefore, it is possible to integrate the pair of external leads 31 and 32 and the auxiliary leads 33, 33 in an insulated manner, and also to extract light via the recess portion 41.

In addition, according to the light-emitting diode package 1 of the present invention, the shape of the recess portion 41 seen in a planar view is a substantially oval shape whose long axis extends along the arrangement direction of the light-emitting diode chips 2, and whose internal surface is paraboloidal. Therefore, in the case where the light-emitting diode package 1 is lighted to irradiate a predetermined target irradiation surface, the emitted rays are parallel rays. As a result, only one high luminance portion is formed on the irradiated surface, making it possible to enhance the light collection efficiency.

(Another Example of Light-emitting Diode Package)

Figure 9:
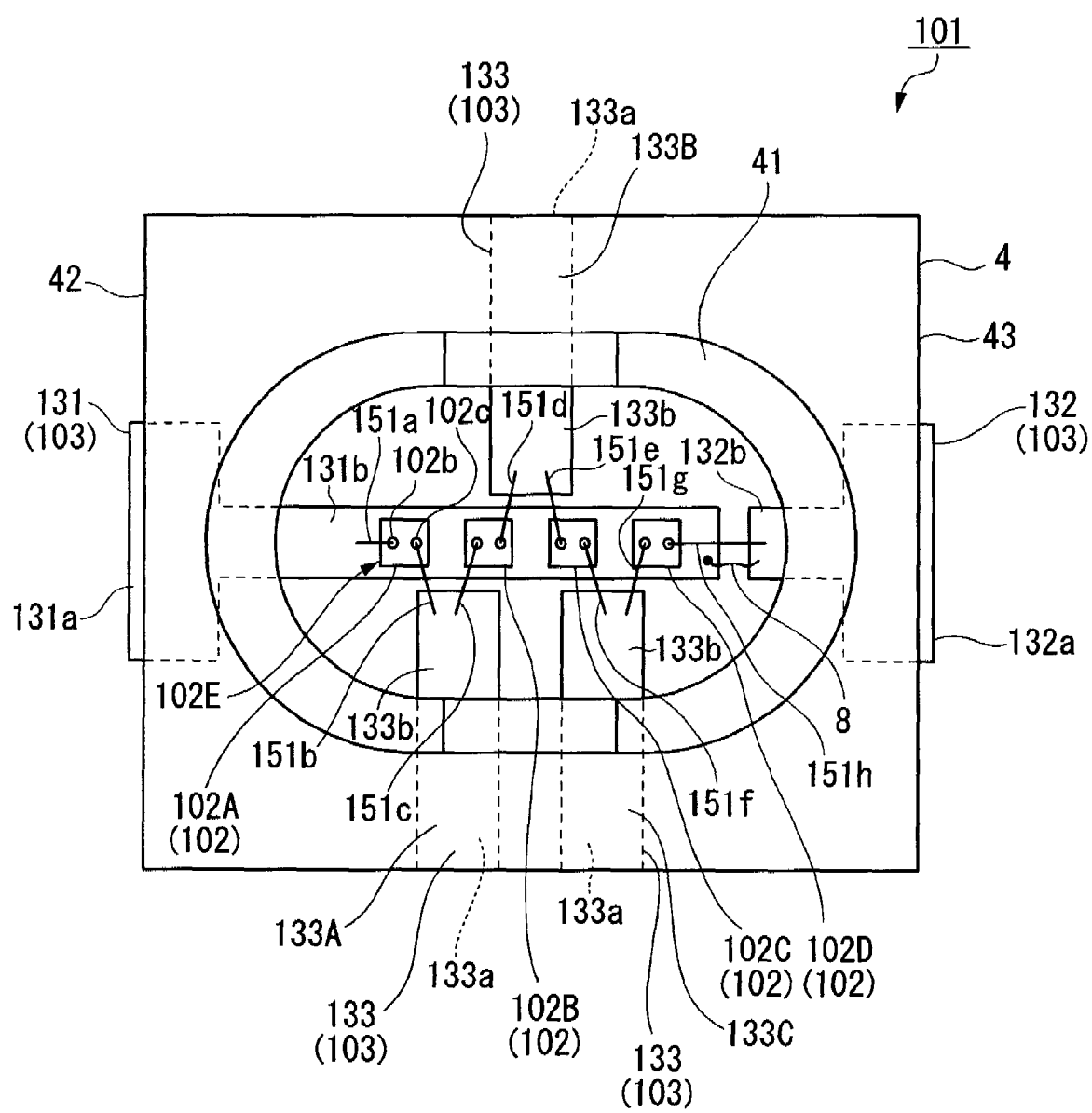
FIG. 9 is a schematic plan view showing another example of a light-emitting diode package according to the present embodiment.

Next is a description of another example of a light-emitting diode package according to the present embodiment, with reference to a drawing. FIG. 9 shows a schematic plan view of another example of the light-emitting diode package. Note that of the constituent elements shown in FIG. 9, constituent elements the same as those shown in FIGS. 1 to 4 are denoted by the same reference numerals. A light-emitting diode chip 102 has the same configuration as that of the aforementioned light-emitting diode chip 2. It is provided with a p-electrode 102$b$ and an n-electrode 102$c$.

A lead group 103 is made of: a first external lead 131; a second external lead 132, and three auxiliary leads 133. The respective leads 131 to 133 are integrated by an insulation structure 4 in a state of being insulated from each other. Furthermore, each of the leads 131 to 133 is formed by punching a thin plate into a predetermined shape, the thin plate being made from metal material of various types, similarly to the case of the aforementioned lead group 3.

The first external lead 131 is made of: a terminal portion 131$a$ a part of which is protruded from one side wall surface 42 of the insulation structure 4; and a band-shaped element placement portion 131$b$ extending from the terminal portion 131$a$ to the interior of the insulation structure 4. On this band-shaped element placement portion 131$b$, there are placed four light-emitting diode chips 102 in one line along the longitudinal direction thereof.

Next, the second external lead 132 is made of: a terminal portion 132$a$ that is protruded from the other side wall surface 43 of the insulation structure 4; and a band-shaped internal terminal portion 132$b$ extending from the terminal portion 132$a$ to the interior of the insulation structure 4. The internal terminal portion 132$b$ is arranged, similarly to the aforementioned internal terminal portion 32$b$, in the extension in the longitudinal direction of the element placement portion 131$b$. As a result, a front end of the internal terminal portion 132$b$ and a front end of the element placement portion 131$b$ are close to each other.

The respective terminal portions 131$a$ and 132$a$ of the respective external leads 131 and 132 are buried in the insulation structure 4 except the portions protruded from the side wall surfaces 42 and 43.

Next, of the three auxiliary leads 133, two are arranged on one side in the longitudinal direction of the element placement portion 131$b$, and one on the other side. The positions of the respective auxiliary leads 133 are offset across the element placement portion 131$b$. Each of these auxiliary leads 133 is a band-shaped member as shown in FIG. 9. It extends along a direction that intersects the longitudinal direction of the element placement portion 131$b$. One end 133$a$ thereof is buried by the insulation structure 4. The other end 133$b$ thereof is arranged at a position facing the element placement portion 131$b$ from a lateral direction.

Next is a description of a connection condition of the light-emitting diode chips 102 placed on the element placement portion 131$b$ to the respective leads 131 to 133.

First, of the four light-emitting diode chips 102 arranged in one line, the p-electrode 102$b$ of the light-emitting diode chip 102A arranged closest to the terminal portion 131$a$ of the first external lead 131 is conductively connected to the element placement portion 131$b$ via the bonding wire 151$a$.

Furthermore, the n-electrode 102$c$ of the light-emitting diode chip 102A is conductively connected to the auxiliary lead 133A via the bonding wire 151$b$.

The p-electrode 102$b$ of the light-emitting diode chip 102B arranged next to the light-emitting diode chip 102A is conductively connected to the auxiliary lead 133A via the bonding wire 151$c$. The n-electrode 102$c$ of the light-emitting diode chip 102B is conductively connected to another auxiliary lead 133B arranged on the side opposite to the auxiliary lead 133A via the bonding wire 151$d$.

Furthermore, the p-electrode 102$b$ of the light-emitting diode chip 102C arranged next to the light-emitting diode chip 102B is conductively connected to the auxiliary lead 133B via the bonding wire 151$e$. In addition, the n-electrode 102$c$ of the light-emitting diode chip 102C is conductively connected to another auxiliary lead 133C arranged on the same side as the auxiliary lead 133A via the bonding wire 151$f$.

The p-electrode 102$b$ of the light-emitting diode chip 102D arranged closest to the second external lead 132 is conductively connected to the auxiliary lead 133C via the bonding wire 151$g$. In addition, the n-electrode 102$c$ of the light-emitting diode chip 102D is conductively connected to the internal terminal portion 132$b$ of the second external lead 132 via the bonding wire 151$h$.

As described above, the light-emitting diode chips 102A to 102D and the respective leads 131 to 133 constituting the lead group 103 are connected in series via the bonding wires 151$a$ to 151$h$, in the order of the external lead 131, the light-emitting diode chip 102A, the auxiliary lead 133A, the light-emitting diode chip 102B, the auxiliary lead 133B, the light-emitting diode chip 102C, the auxiliary lead 133C, the light-emitting diode chip 102D, and the external lead 132.

That is, light-emitting diode chips 102A to 102D are connected in series to constitute a diode group 102E. To both ends of this diode group 102E, the external leads 131 and 132 are conductively connected. In addition, between the respective light-emitting diode chips 102A to 102D that constitute the diode group 102E, the auxiliary leads 133A to 133C are conductively connected, respectively. The auxiliary leads 133A to 133C are arranged on both sides in the width direction of the element placement portion 131$b$. This makes it possible to arrange the light-emitting diode chips 102A to 102D close to each other.

The auxiliary leads 133A to 133C may be arranged on one side in the width direction of the element placement portion 131$b$. However, for the similar reason that for the aforementioned light-emitting diode package 1, it is preferable that the auxiliary leads 133A to 133C be arranged on both sides in the width direction of the element placement portion 131$b$.

According to the above light-emitting diode package 101, the number of the light-emitting diode chips 102 is larger than that of the light-emitting diode chips of the aforementioned light-emitting diode package 1. Therefore, it is possible to increase the quantity of light.

(Still Another Example of Light-emitting Diode Package)

Figure 10:
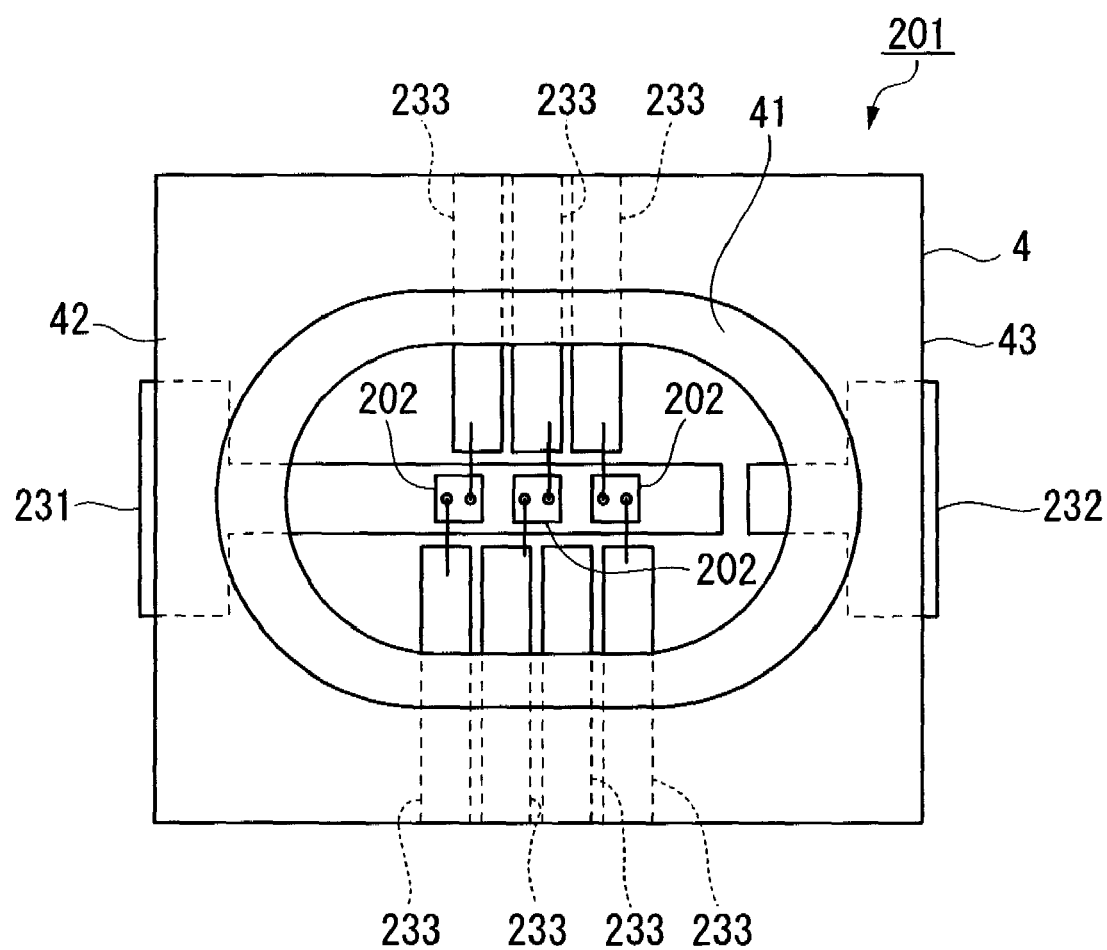
FIG. 10 is a schematic plan view showing still another example of a light-emitting diode package according to the present embodiment.

FIG. 10 shows a schematic plan view of a light-emitting diode package 201 in which three light-emitting diode chips 202 are connected in parallel. This light-emitting diode package 201 includes a lead group for use when eight light-emitting diode chips are connected in series. This lead group is made of: a pair of external leads 231 and 232 and seven auxiliary leads 233. Of the seven auxiliary leads, six auxiliary leads are used as terminals of the light-emitting diode chips 202. Therefore, when the light-emitting diode chips 202 are driven, these six auxiliary leads may be connected to a power source, and electricity may be passed.

In this manner, according to the lead group structure of the present invention, it is possible not only to connect the light-emitting diodes in series, but also to connect the light-emitting diodes in parallel.

Furthermore, it is possible to commonalize the lead frame with the package shape. This is favorable also for cost reduction.

INDUSTRIAL APPLICABILITY

According to the present invention, it is possible to provide a light-emitting diode package that has a large light quantity, and is capable of transforming rays emitted from respective light-emitting diode chips into parallel rays for efficient light collection, and to provide a lead group structure for the light-emitting diode package. This is of great industrial significance.

The invention claimed is:

1. A light-emitting diode package comprising: a diode group made of a plurality of light-emitting diode chips connected in series and a lead group connected to the diode group, wherein
the lead group comprises: a pair of external leads as terminals of the diode group and auxiliary leads the number of which is one less than that of the light-emitting diode chips,
the plurality of the light-emitting diode chips are arranged in one line on a first external lead of the pair of external leads,
the auxiliary leads are arranged on one or both sides of a row made of the plurality of the light-emitting diode chips, and
the adjacent light-emitting diode chips of the plurality of light-emitting diode chips are connected in series via the auxiliary leads.

2. The light-emitting diode package according to claim 1, wherein
an element placement portion on which the light-emitting diode chips are placed are formed on the first external lead,
p-electrodes and n-electrodes of the light-emitting diode chips face to a side opposite to the element placement portion, and
the p-electrodes and the n-electrodes are connected to the auxiliary leads via bonding wires.

3. The light-emitting diode package according to claim 2, wherein
a front end of the element placement portion is arranged close to a second external lead.

4. The light-emitting diode package according to claim 2, wherein
a zener diode is attached between the front end of the element placement portion and the second external lead.

5. The light-emitting diode package according to claim 1, further comprising an insulation structure for holding the lead group to which the diode group is connected, wherein
the diode group is exposed from a recess portion formed in the insulation structure.

6. The light-emitting diode package according to claim 5, wherein
the shape of the recess portion seen in a planar view is a substantially oval shape the long axis of which extends along an arrangement direction of the plurality of light-emitting diode chips, and
the internal surface of the recess portion is a paraboloidal reflective surface.

* * * * *